US006834246B2

United States Patent
Stubblefield et al.

(10) Patent No.: US 6,834,246 B2
(45) Date of Patent: Dec. 21, 2004

(54) MULTIPROBE BLOB TEST IN LIEU OF 100% PROBE TEST

(75) Inventors: Todd D. Stubblefield, Sherman, TX (US); Eugene T. Gharis, Sherman, TX (US); George W. Reeves, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 136 days.

(21) Appl. No.: 10/222,870

(22) Filed: Aug. 19, 2002

(65) Prior Publication Data

US 2004/0034493 A1 Feb. 19, 2004

(51) Int. Cl.[7] .......................... G06F 19/00; G01N 37/00
(52) U.S. Cl. .......................... 702/84; 702/35; 702/182; 438/10; 438/14; 324/750; 324/757
(58) Field of Search .......................... 702/35, 83, 84, 702/117, 182, 183; 438/10, 14, 19; 324/750, 755, 757, 765; 700/108–110

(56) References Cited

U.S. PATENT DOCUMENTS 5,326,709 A * 7/1994 Moon et al. .................. 438/4
6,021,380 A * 2/2000 Fredriksen et al. .......... 702/35
6,043,101 A * 3/2000 Stubblefield et al. ........ 438/10

* cited by examiner

*Primary Examiner*—Bryan Bui
(74) *Attorney, Agent, or Firm*—W. James Brady, III; Frederick J. Telecky, Jr.

(57) ABSTRACT

A method of predicting the effect of blob test in GSP sample testing is disclosed. The method includes extracting failure density maps from sample test results, where the density of any failed cell is expressed as the number of adjacent failing sample cells; determining the existence of local concentration of bad chips (blobs) as the occurrence of a detection density value above a threshold which can be adjusted to control the sensitivity of blob detection; determining the extent of such identified blobs as the occurrence of adjacent cells with density values above an inclusion threshold, which can be adjusted to control the sensitivity of blob extent determination; calculating a residual sample yield $Y_{NB}$ for the areas outside blob regions using the total sample cell count $N_S$, the passing cell count $N_G$, and the count of cells in blobs $N_B$ by equation:

$$Y_{NB} = \frac{N_G}{N_S - N_B};$$

and re-evaluating the decision of whether 100% probe test is required or if the cost savings can still be realized by performing only blob test.

8 Claims, 8 Drawing Sheets

MULTIPROBE BLOB TEST IN LIEU OF 100% PROBE TEST

FIELD OF INVENTION

This invention relates to testing semiconductor wafers and more particularly to determining the cost savings of a multiprobe sample (blob) test in lieu of 100% probe test.

BACKGROUND OF INVENTION

Massive quantities of completed fabricated integrated circuits are functionally tested by being probed in wafer form by multiprobe test device before separation and encapsulation of the integrated circuits into individual packages (assembly). Since the circuits are again tested after assembly and before shipment to customers, the justification for probing wafers is to avoid the cost of assembly on non-functional circuits. Wafer testing adds a significant cost to the wafers and when chip yields are very high, the cost of wafer test is more than the resultant cost that would result from assembly of small number of non-functional circuits. A sample test procedure is therefore employed to identify wafers with high enough yield to allow cost effective avoidance of 100% test. The yield point below which this procedure is not cost effective is calculated as a hurdle. If the sample yield on a wafer is below the point where reduced test is cost effective, that wafer is 100% tested. Since this yield threshold is high, a significant number of wafers must be fully tested adding extra cost, decreasing test capacity and hampering production planning by introducing variability in manufacturing cycle time.

Sample wafer testing has been done with a procedure called Good Sample Probe (GSP). The procedure is illustrated in FIG. 1 and is as follows.

Divide the wafer into cells containing a number of chips, e.g. a 4×3 chip cell would contain 12 chips. FIG. 2 illustrates a wafer sample plan. The chips are bounded by black lines and the cells are bounded by very light grey lines surrounding the twelve chips. One of the good cells is circled and presented as expanded view with the cell outlined in black.

Randomly select one chip within each cell. The one chip for each cell is outlined in white in bad areas or totally white in good areas in FIG. 2. The set of selected chips is the sample to be tested.

Test the set of sample chips and calculate the yield of the sample. In FIG. 2 white represents good chips.

Calculate the yield threshold point $Y_{TH}$ below which the savings afforded by reduced testing is greater than the cost of assembling some quantity of failing chips.

If the sample yield is below the threshold, the remaining chips on the wafer must be 100% tested to avoid the high cost of assembly on chips that will fail final test. FIG. 3 illustrates wafer map of fully probed wafer where the wafer yield is 80.63%.

If the sample yield is above the threshold, the wafer can be shipped for assembly without further testing. One additional test operation is, however, performed on this wafer. FIG. 2 shows the wafer sample plan where the sample yield was 80.91%. The yield threshold is 97.15%, so the cost of assembly of bad chips would exceed the savings of reduced sample test. The white chips are good chips, the band of light grey chips around the perimeter is the excluded chips (not tested or assembled). All other grey shades are test failures.

Perform "blob test" on wafers that passed the sample yield threshold criterion.

The Blob test is a procedure that tests all chips adjacent to any sample chip that failed during the initial pass. All neighbors of any additional failures are then tested. This cycle is repeated until no new test failures are found. All bad chips in close proximity to each other will be tested and marked as bad. Since failing chips often occur in tight groups, blob test finds and marks as bad a significant fraction of additional, as yet untested chips that may exist on the wafer, reducing assembly cost with only a minimal increase in test cost.

It is desirable to predict the effect of blob test in GSP sample testing and improve the decision to perform the blob test in lieu of 100% probe testing.

SUMMARY OF INVENTION

In accordance with one embodiment of the present invention a method is provided to identify such blobs and determine when it is cost effective to do blob test in lieu of 100% probe test.

In accordance with an embodiment of the present invention on wafers with low sample yield, implement a special regional analysis to identify potential concentrations of bad chips. Many wafers can then use a process called "blob test" in place of 100% probe test, and still avoid assembly and subsequent scrap of large quantities of bad chips.

In accordance with an embodiment of the present invention a method for identifying when a blob test would be sufficient to reduce the number of untested bad chips to a level where cost savings can still be realized includes the steps of analyzing the sample results to identify blobs that will be tested out by blob test, estimating the yield of the remaining area of the wafer and determining if that residual yield is high enough to avoid 100% probe test and still realize a cost savings.

In accordance with an embodiment of the present invention a method of predicting the effect of blob test in GSP sample testing includes the steps of extracting failure density maps from sample test results, where the density of any failed cell is expressed as the number of adjacent failing sample cells; determining the existence of local concentration of bad chips (blobs) as the occurrence of a detection density value above a threshold which can be adjusted to control the sensitivity of blob detection; determining the extent of such identified blobs as the occurrence of adjacent cells with density values above an inclusion threshold, which can also be adjusted to control the sensitivity of blob extent determination; calculating a residual sample yield $Y_{NB}$ for the areas outside blob regions using the total sample cell count $N_S$, the passing cell count $N_G$, and the count of cells in blobs $N_B$ by equation:

$$Y_{NB} = \frac{N_G}{N_S - N_B};$$

and re-evaluating the decision of whether 100% probe test is required or if the cost savings can still be realized by performing only blob test.

DESCRIPTION OF PREFERRED EMBODIMENT OF THE INVENTION

Many wafers with relatively low yield have one or more localized concentrations, or blobs of bad chips, while the remainder of the wafer has relatively few bad chips. After sample testing, the sample yield indicates that 100% test would be less costly than assembly of untested (not sampled) chips that will subsequently fail final test. The present invention is a method for identifying when blob test, as described above would be sufficient to reduce the number of untested bad chips to a level where a cost savings can still be realized. Some wafers which fail the sample test yield threshold do so because of one or more local concentrations, or blobs, of bad chips. In many cases, most or all chips in a region are bad and blob test would suffice to test out the majority of bad chips without the need for 100% test.

Figure 1:
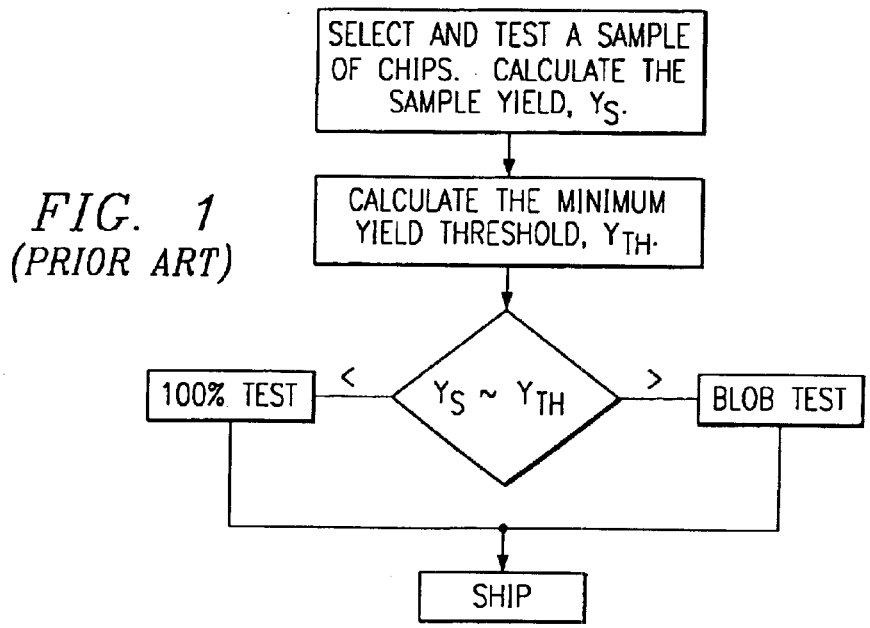
FIG. 1 is a GSP Flow Diagram according to the prior art.
Figure 4:
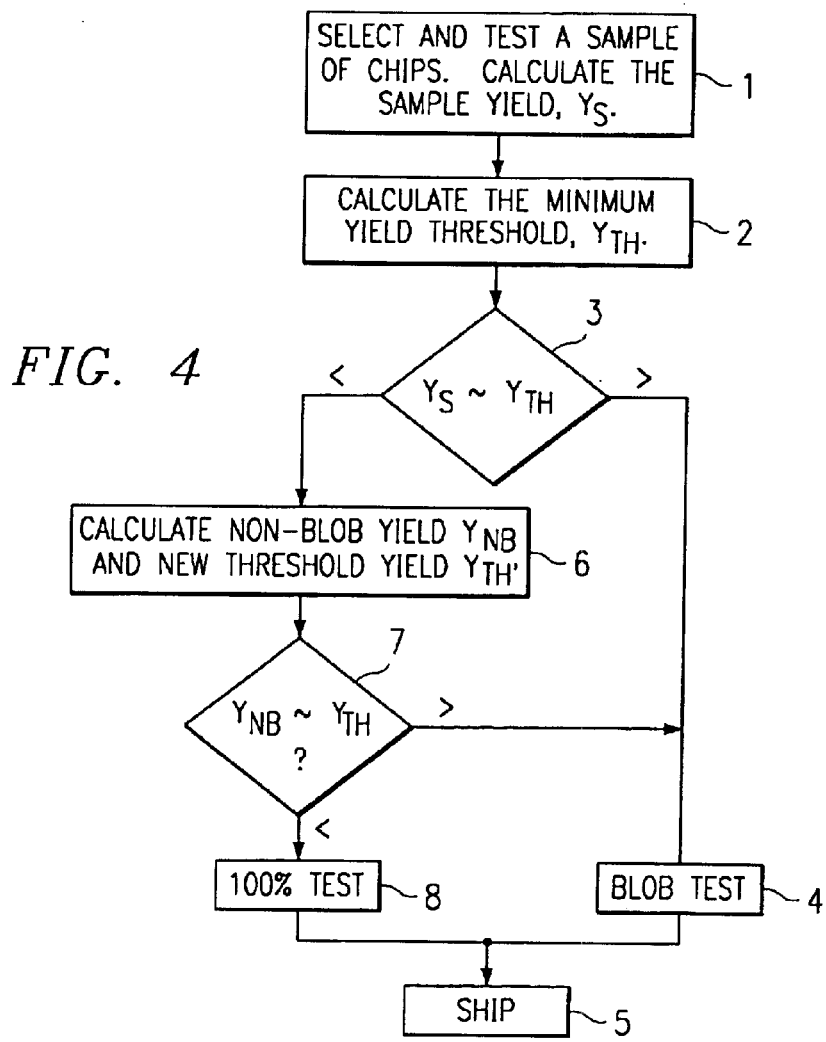
FIG. 4 illustrates the GSP flow diagram according to one embodiment of the present invention.

The method by which this is accomplished is by analyzing the sample results to (1) identify blobs that will be tested out by the blob test, (2) estimate the yield of the remaining area of the wafer and (3) determine if that residual yield is high enough to avoid 100% probe test and still realize cost savings. The new flow chart according to the present invention is illustrated in FIG. 4. In step 1 the sample of chips is selected and tested and the sample yield is calculated. In Step 2 the yield point threshold $Y_{TH}$ is calculated as done in the GSP sample testing wherein the threshold point is the point below which the savings afforded by reduced testing is greater than the cost of assembling some quantity of failing chips.

Figure 5:
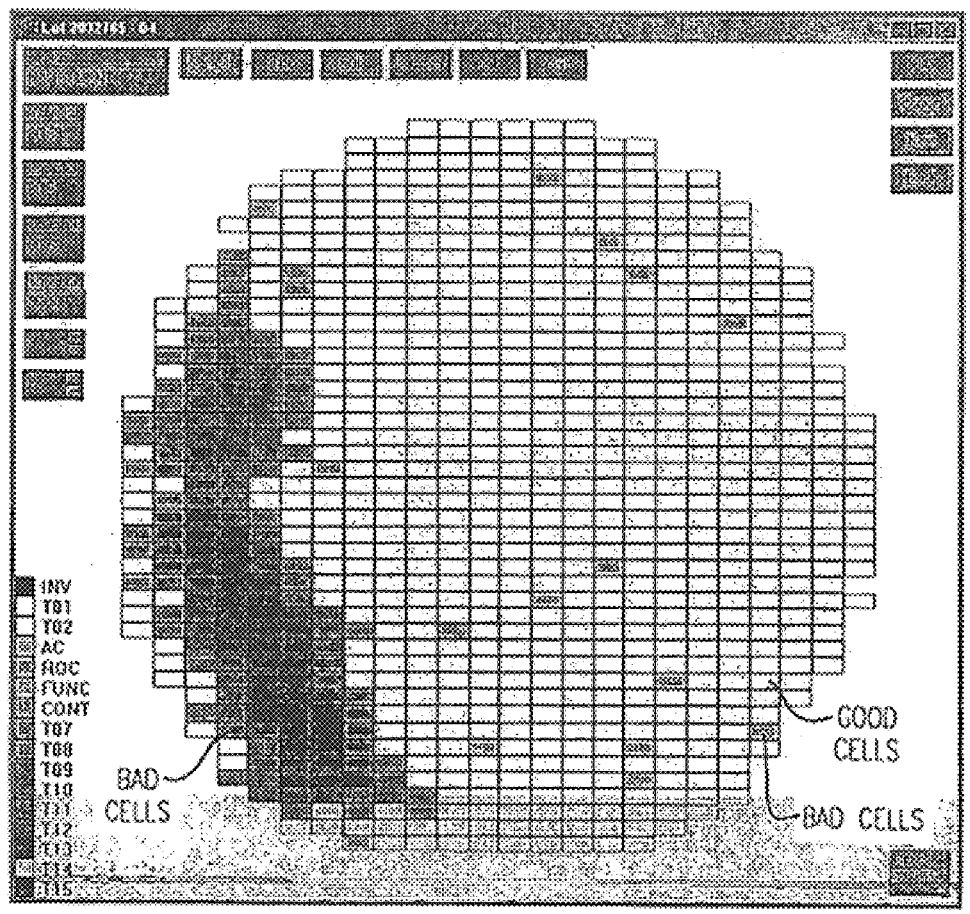
FIG. 5 is a sample cell failure density map.

In the blob detection scheme each cell has one sample chip. Since each cell has one sample chip, the cells can be analyzed as a more granular version of a wafer map. The cell map for the example wafer is shown in FIG. 5, sample cell failure density map. This map shows the sample test results expressed as density of failures. Each cell is assigned the pass/fail result value of its sample chip. The neighborhood around each "bad" cell is then examined and the number of bad neighbors is counted. The resultant count is zero for an isolated bad cell up to 8 for one completely surrounded by other bad cells. This information gives immediate visibility of concentrations of bad cells.

Once sample failure density information is available, the existence of a blob is indicated by the occurrence of a density count above some threshold value such as 3. This is the blob detection threshold number. Once the presence of a blob has been determined, the neighbors of the initial cell found are examined to see if they should be included in the blob. The threshold for inclusion in a blob, once identified, is not necessarily the same as the detection threshold. For example, a density count of 2 in a cell adjacent to the blob may be added to the blob although a higher detection threshold may have been used.

Figure 2:
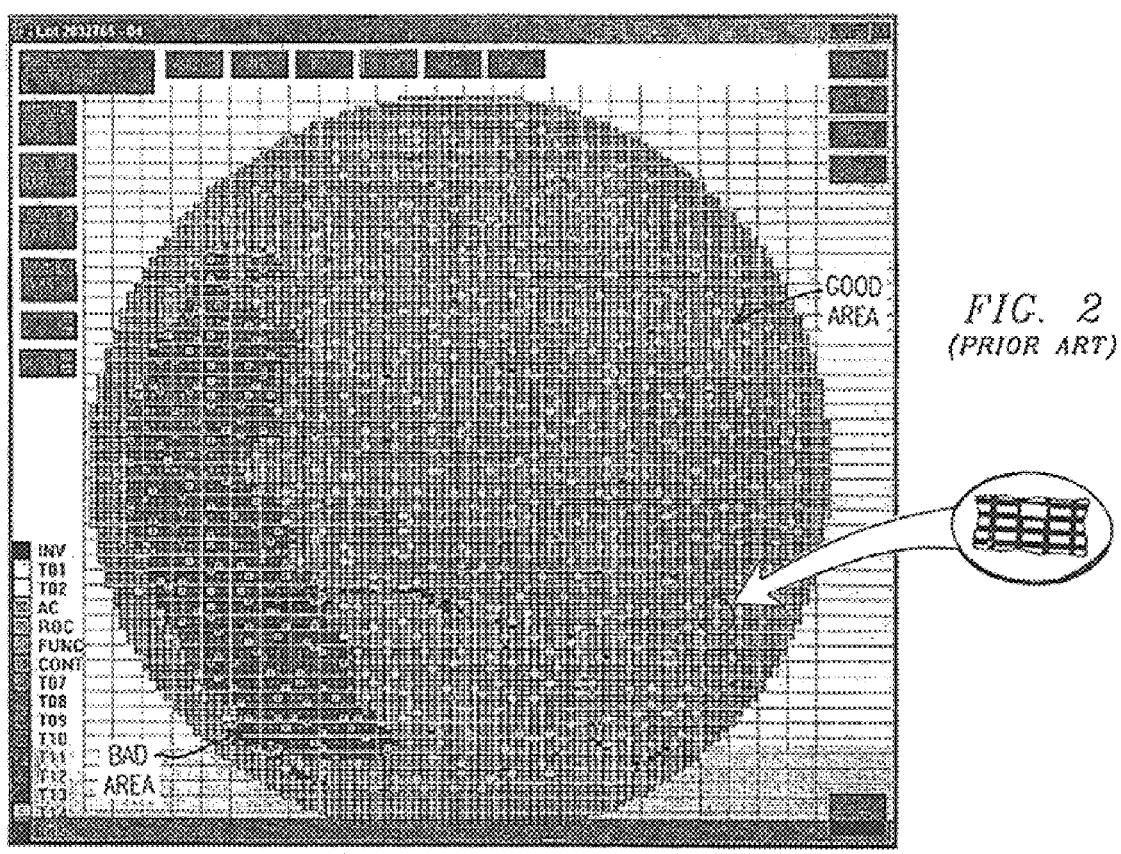
FIG. 2 illustrates a wafer sample plan.
Figure 3:
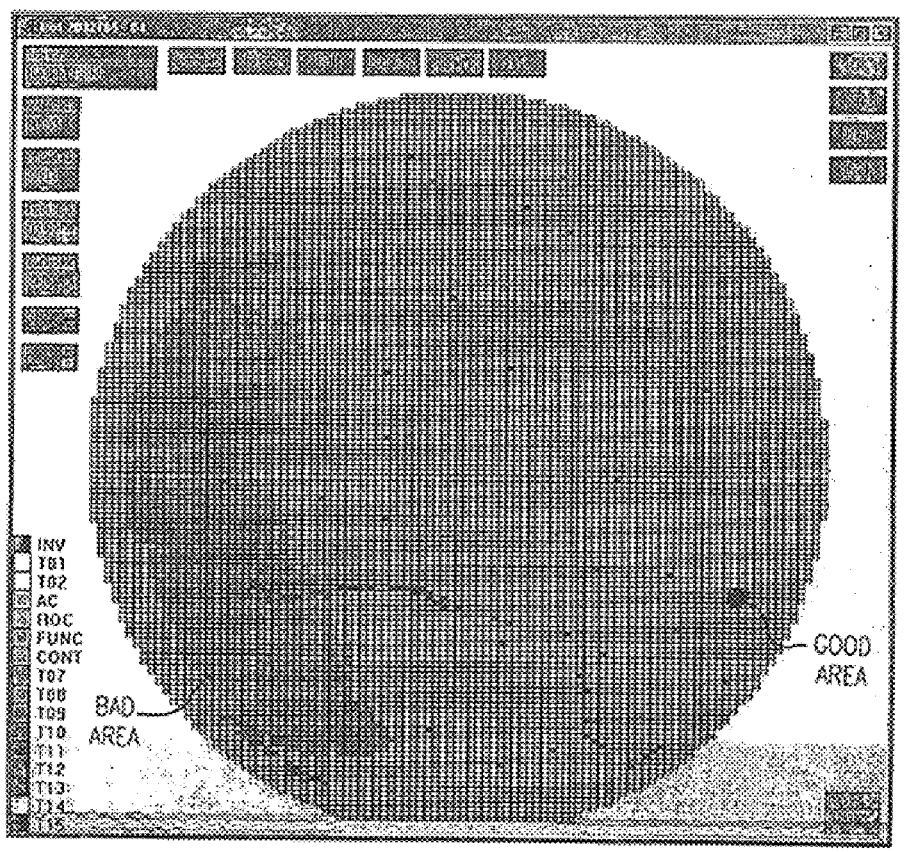
FIG. 3 is a wafer map of fully probed wafer wherein the wafer yield is 80.63%.

The map of FIG. 5 shows the sample cells from the wafer depicted in FIG. 2. Cells in which the sample chip tested good are white. Grey to black shades indicate cells with a bad sample chip. The shade of grey indicates the number of other adjacent cells which also failed. The use of separate threshold values to detect a blob and to determine its extent allows a wide latitude for tuning the procedure to make it more or less sensitive. Minimum sensitivity (high density thresholds) will identify only large, well defined blobs. Maximum sensitivity can incorrectly predict that low density failures are part of a blob and overestimate the beneficial effect of the blob test.

Figure 6:
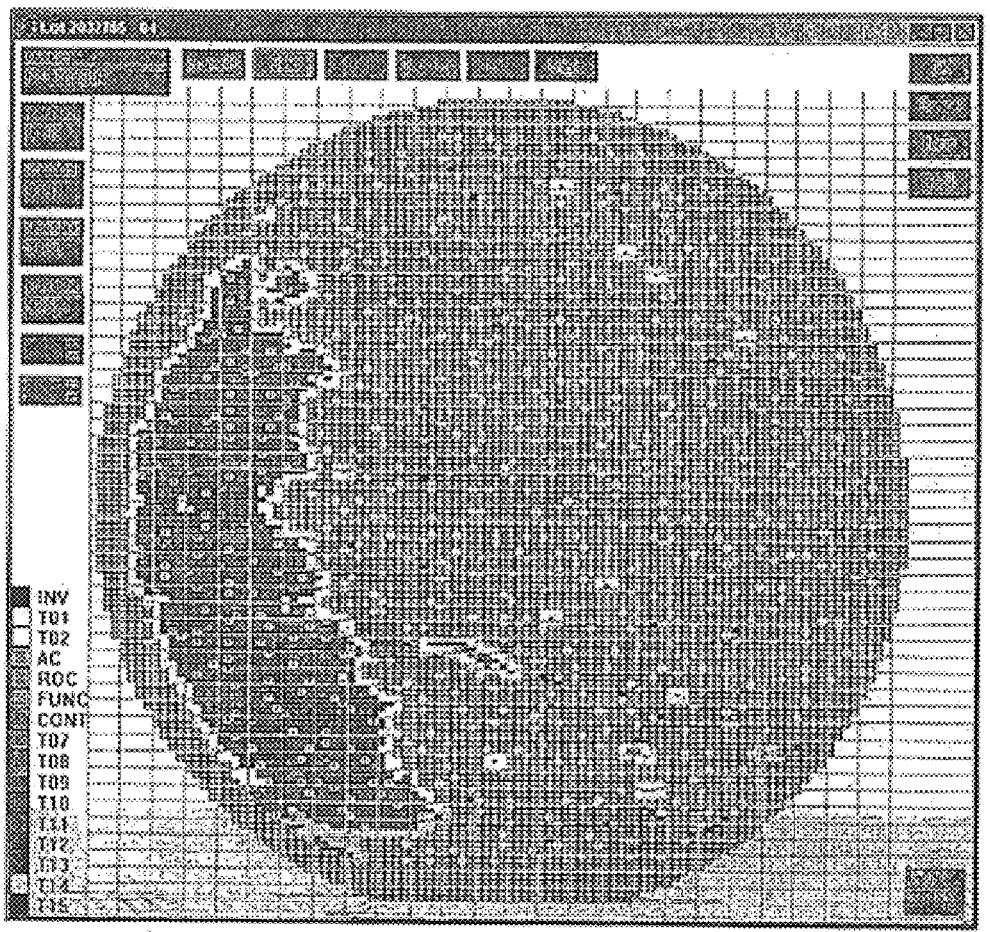
FIG. 6 illustrates the chips that were tested during blob test and the blob test results.

The use of separate detection and inclusion threshold values also allows the algorithm to more accurately detect less well defined blobs than the one depicted in the example wafer of FIGS. 2–3, and 5–6. In FIG. 6 the diagram shows the chips that were tested during the blob test. Blob tested chips are outlined in white (good chip) or grey (bad chip), except that the original sample chips are still outlined in white or all white. Using a blob detection threshold of 3 and an inclusion threshold of 2, the analysis predicted that the blob would be removed, leaving a non-blob yield of 97.52%. The actual residual yield of chips not found by blob test or the original sample was 98.6%.

Figure 7:
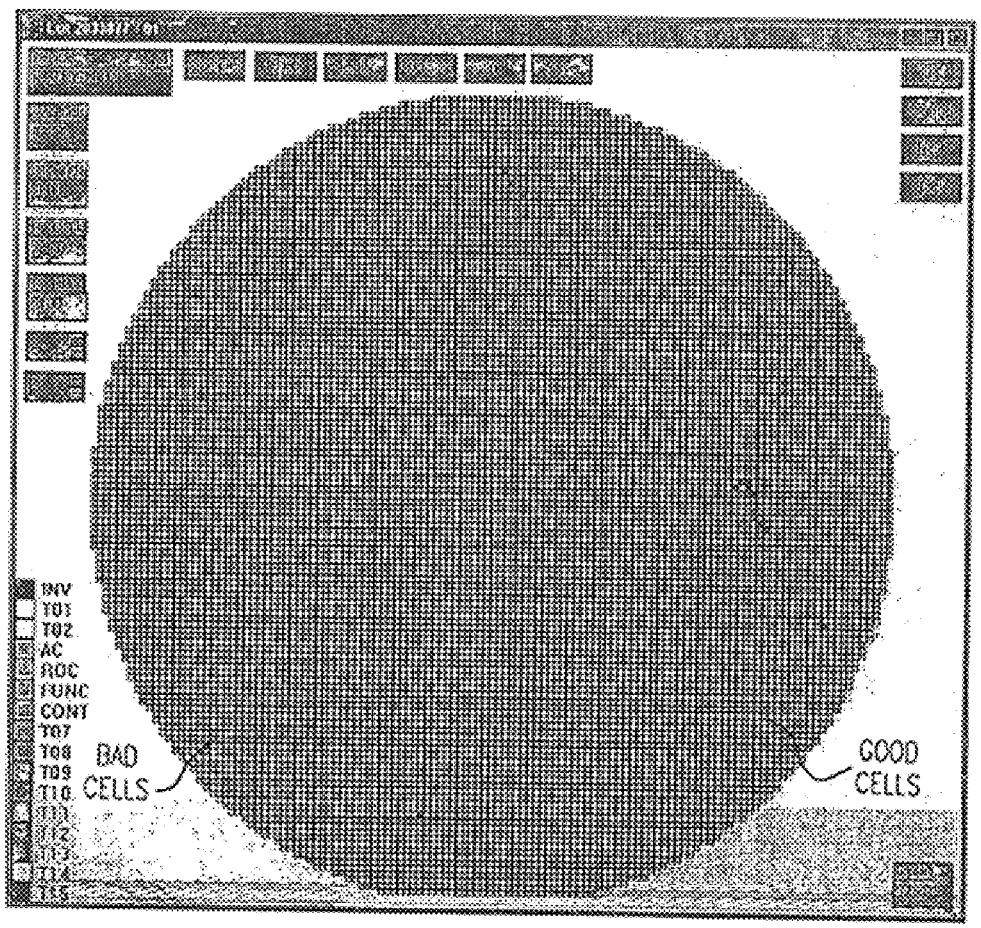
FIG. 7 illustrates blob with feathered edges.
Figure 8:
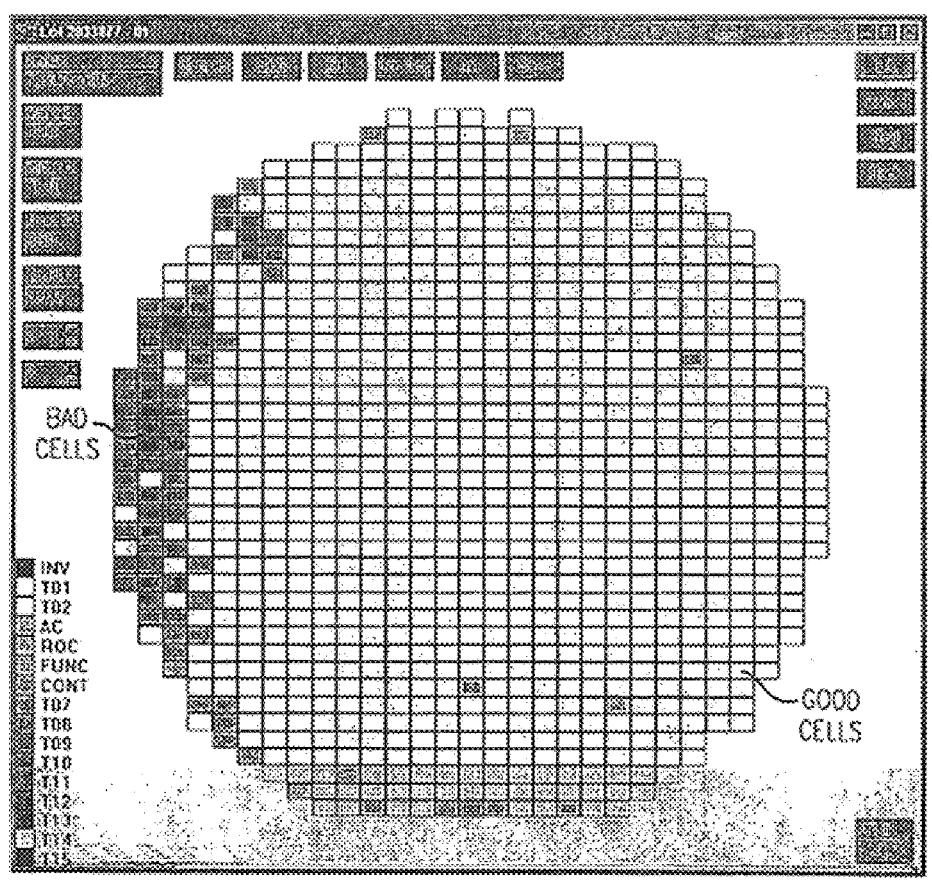
FIG. 8 illustrates a sample cell fail density map blob with feathered edges.
Figure 9:
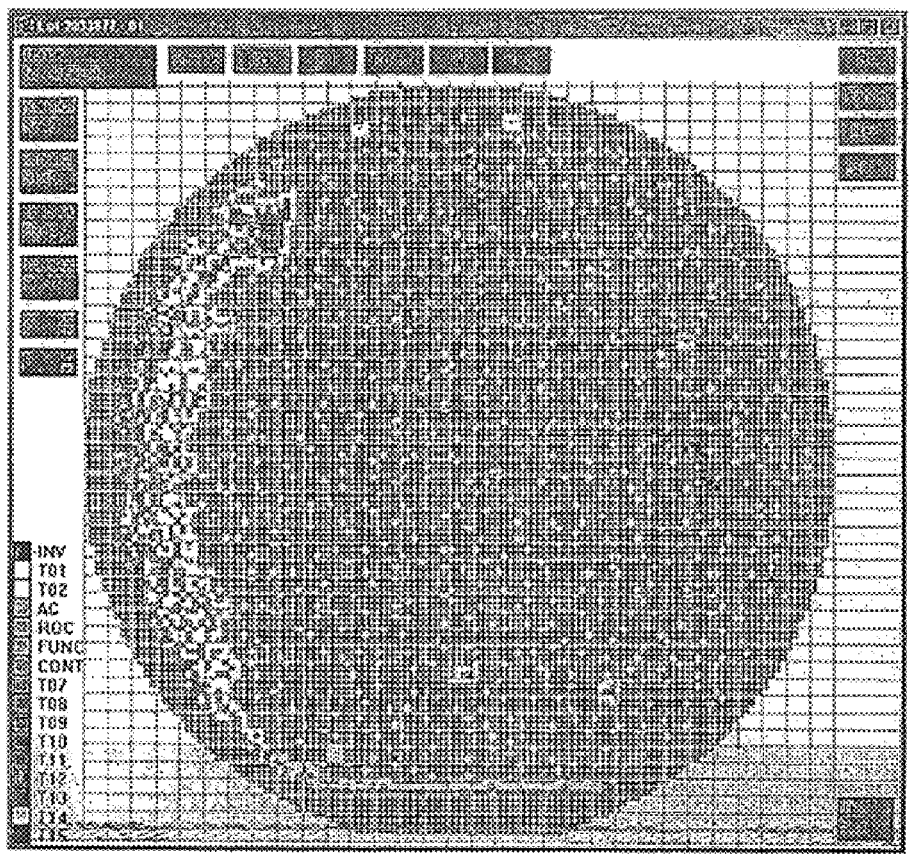
FIG. 9 illustrates blob test results with feathered edges.

The wafer maps shown in FIGS. 7–9 show an example of a blob with feathered edges. In FIG. 8 cells in which the sample chip tested good are white. Shades of grey indicate cells with a bad sample chip. The darkness of the cell indicates the number of other adjacent cells which also failed, ranging from 0 to all 8, with the higher counts being darker. This type of blob area is more difficult to detect than one with sharp, well defined edges. FIG. 8 illustrates the sample cell fail density map for a blob with feathered edges. An inclusion threshold that is lower than the detection threshold more accurately predicts the blob test results than a single threshold method can. The actual post blob test residual would have been 98.04%. Using 3 and 2 respectively as the detection and inclusion threshold values, the predicted post blob test residual yield is 98.33%. FIG. 9 illustrates the blob test results for this blob with feathered edges. The grid for the cells is defined by the very light grey lines, the sample chips by the white boxes, and the good chips in white. Using 3 and 3, the prediction would be 97.35%, while the threshold values of 2 and 2 would predict 98.44%.

The ability of the blob identification algorithm to be adjusted is necessary to allow the decision algorithm to be tailored to the cost structures of the wafer and assembly factories employing the methodology. For high test cost and/or low assembly cost operations, a high sensitivity will identify larger blob areas. This will tend to favor reduced test over reduced assembly losses. Lower sensitivity will tend to favor low test cost and/or high assembly cost operations.

Also, factors other than simple test and assembly costs can make selection of a different sensitivity level desirable. One such factor could be that the worst case prediction error of a high sensitivity blob detection scheme could cause perturbations in assembly factory flow. Conservative blob detection may be called for to give more operational predictability at the expense of sacrificing some potential savings at wafer test.

In step 3 of FIG. 4 if the sample yield $Y_S$ is greater than the minimum yield threshold $Y_{TH}$ then the blob test is performed Step 4 before shipping in Step 5. If the yield $Y_S$ is less than the minimum yield threshold step 6 is performed to calculate non-blob yield $Y_{NB}$ and new threshold yield $Y_{TH}$.

The predicted yield of the non-blob area of the wafer is calculated as the original good sample cell count divided by the total number of cells minus the identified blob cells. This is based on the fact that the identified blob cells (all "bad") will be removed from the sample blob test. The residual yield is therefore the "good" cells as a fraction of those cells remaining in the sample.

$$Y_{NB} = \frac{N_G}{N_S - N_B}$$

where
$Y_{NB}$ is the "non-blob" yield
$N_G$=Number of good sample cells
$N_S$=Total number of sample cells
$N_B$=Number of blob cells A new threshold $Y_{TH}$ yield for the decision to full test the wafer is calculated as described in the following paragraphs.

The estimated savings of blob test is proportional to the ratio of identified blob cells to the total number of cells. The added cost at assembly is proportional to the predicted number of untested bad chips, which is a function of $Y_{NB}$.

The details of such calculation are dependent on the cost structure of the factories, and would be a fairly simple operation given $N_B$ and $Y_{NB}$. The yield point where the savings and cost are equal is the new threshold. If a significant number of wafers have groupings of bad chips that are not detectable from the sample yield results, the new threshold yield may be lower than the calculated value. The actual optimum threshold point can be empirically determined by computer analysis of a significant number of wafer maps that represent the typical products of the wafer factory.

The adjusted sample yield $Y_{NB}$ is compared to the new threshold yield, $Y_{TH}$ in Step 7. If $Y_{NB}>Y_{TH}$, the wafer may be blob tested and shipped. If not it is 100% probe tested in Step 8.

To maximize the tunability features of the present invention, an analysis is done on a representative sample of wafer maps, using the cost structures of the wafer and assembly factories concerned. Such an analysis may consist of the following steps:

Select a large, representative sample of 100% probe tested wafer maps for analysis. A wafer map may be any representation that includes chip position and pass/fail information.

Determine wafer test cost and assembly cost per chip. A simple analysis could use factory averages for these factors, or a more detailed analysis could differentiate more finely, such as by technology group, device type, or even individual chip.

For each wafer in the sample, calculate the threshold yield above which the wafer test cost avoidance exceeds the additional assembly cost of untested chips which would fail final test.

Simulate sample testing for each wafer in the sample and identify those wafers on which the sample yield is below the yield threshold.

For each wafer which fails the yield threshold, perform blob identification using a range of detection and inclusion threshold values. For each set of blob identification threshold values:

Calculate an adjusted sample yield which excludes the detected blob cells.

Compare the adjusted sample yield to a range of threshold yields. These threshold values may be higher or lower than that used for the first pass test. Since blob test can be significantly more effective than the prediction, the average impact of a large sample may be better than that predicted by the adjusted sample yield.

For wafers that exceed the threshold yield collect the following data, subtotaled for each combination of blob identification thresholds and yield threshold:
The number of wafers passing the threshold.
The number of chips tested by the blob test.
The number of untested bad chips.

Using these data, calculate and accumulate the following:
The wafer test cost savings, calculated as the number of untested chips multiplied by the assembly cost. The assembly cost, calculated as the number of untested bad chips multiplied by the assembly cost.

For each subtotal group, examine the per-wafer average and distribution of net savings. The combination with the highest average net savings may not be the best choice if it allows individual wafer "escapes" where the prediction actual results disagree with the prediction enough to cause indirect costs not included in the original analysis. This could include disruptions caused by unexpectedly low yields that result in not being able to ship the needed quantity of a particular chip type.

Select the optimum blob identification threshold values and threshold yield target for implementation in the wafer factory.

What is claimed is:

1. A method of predicting the effect of a blob test GSP sample testing comprising the steps of:

extracting failure density maps from sample test results, where the density of any failed cell is expressed as the number of adjacent failing sample cells; determining the existence of local concentration of bad chips (blobs) as the occurrence of a detection density value above a threshold which can be adjusted to control the sinsitivity of blob detection;

determining the extent of such identified blobs as the occurrence of adjacent cells with density values above an inclusion threshold, which can be adjusted to control the sinsitivity of blob extent determination;

calculating a residual sample yield $Y_{NB}$ for the areas outside blob regions using the total sample cell count $N_S$, the passing cell count $N_G$, and the count of cells in blobs $N_B$ by equation:

$$Y_{NB} = \frac{N_G}{N_S - N_B};$$

and re-evaluating the decision of whether 100% probe test is required or if the cost saving can still be realized by performing only blob test.

2. A method of claim 1 wherein the number of failing sample cells is between 0 and 8.

3. The method of claim 1 wherein the blob detection threshold is varied to maximize the benefit of the manufacturing facility.

4. The method of claim 3 wherein the blob inclusion threshold is varied to maximize the benefit of the manufacturing facility.

5. The method of claim 1 wherein the blob inclusion threshold is varied to maximize the benefit of the manufacturing facility.

6. A method of testing chips on a semiconductor wafer comprising the steps of:

selecting and testing a sample of chips on said wafer and calculating the sample yield $Y_S$;

calculating a first yield threshold below which the savings afforded by reduced testing is greater than the cost some quantity of failing chips;

performing blob test on wafers that passed the sample yield threshold; for those that did not pass the first yield threshold calculating a non-blob yield $Y_{NB}$ for those areas outside blob region using total sample count $N_S$, the passing cell count $N_G$, and the count of cells in blobs $N_B$ by equation:

$$Y_{NB} = \frac{N_G}{N_S - N_B};$$

calculating a new threshold $Y_{TH}$ using separate detection and inclusion threshold values;

performing the blob test if the non-blob yield exceeds the new threshold $Y_{TH}$; and if not performing 100 percent probe test.

7. The method of claim 6 wherein said detection threshold is based on the local concentration of bad chips or blobs around each bad cell and said inclusion threshold is the number of neighbors of the initial cell that are included in the blob.

8. The method of claim 7 wherein said inclusion threshold is lower than said detection threshold.

* * * * *